United States Patent
Heo et al.

(10) Patent No.: US 9,410,994 B2
(45) Date of Patent: Aug. 9, 2016

(54) REFRIGERATOR AND OPERATION METHOD THEREOF

(75) Inventors: Seonggeun Heo, Seoul (KY); Sungnam Ryoo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 138 days.

(21) Appl. No.: 13/885,648

(22) PCT Filed: Nov. 15, 2010

(86) PCT No.: PCT/KR2010/008039
§ 371 (c)(1),
(2), (4) Date: May 15, 2013

(87) PCT Pub. No.: WO2012/067277
PCT Pub. Date: May 24, 2012

(65) Prior Publication Data
US 2013/0229172 A1 Sep. 5, 2013

(51) Int. Cl.
*G01R 21/00* (2006.01)
*F25D 29/00* (2006.01)

(52) U.S. Cl.
CPC ............... *G01R 21/00* (2013.01); *F25D 29/00* (2013.01); *F25D 2400/361* (2013.01); *F25D 2700/02* (2013.01)

(58) Field of Classification Search
CPC ... G01R 21/00; F25D 29/00; F25D 2400/361; F25D 2700/02
USPC .............................. 324/157; 700/295–297, 90
See application file for complete search history.

(56) References Cited

U.S. PATENT DOCUMENTS

| | | | | |
|---|---|---|---|---|
| 4,463,348 A * | 7/1984 | Sidebottom | | 340/585 |
| 6,216,478 B1 * | 4/2001 | Kang | | 62/228.4 |
| 6,729,147 B2 * | 5/2004 | Lee | | F25D 29/00 62/131 |
| 6,739,146 B1 * | 5/2004 | Davis | | F25D 21/006 62/155 |
| 8,412,387 B2 * | 4/2013 | Park | | G06Q 50/06 307/118 |
| 2002/0000092 A1 * | 1/2002 | Sharood | | G05B 19/00 62/127 |

(Continued)

FOREIGN PATENT DOCUMENTS

JP 2005-249358 A 9/2005
JP 2008-14501 A 1/2008

(Continued)

OTHER PUBLICATIONS

JP 2005249358 (Machine Translation to English) Kamon et al, "Refrigerator system and its program." Sep. 15, 2005.*

(Continued)

*Primary Examiner* — Melissa Koval
*Assistant Examiner* — Felicia Farrow
(74) *Attorney, Agent, or Firm* — Birch, Stewart, Kolasch & Birch, LLP (57) ABSTRACT

According to the present invention, a refrigerator that may save power rates is provided. The refrigerator according to the present invention includes a door; a communication unit; a sensing unit; a memory unit; an output unit; and a controller configured to sense an opening state of the door, obtain power consumption information consumed as the door is opened from the memory unit considering at least one of the opening state of the door and an attribute of the door and configured to output through the output unit power rates information corresponding to the power consumption information, considering power information received through the communication unit.

10 Claims, 10 Drawing Sheets

(56) References Cited

U.S. PATENT DOCUMENTS

| | | | |
|---|---|---|---|
| 2005/0178131 A1* | 8/2005 | Ryu | F25D 11/02 62/131 |
| 2006/0123807 A1* | 6/2006 | Sullivan et al. | 62/129 |
| 2006/0248824 A1* | 11/2006 | Cho et al. | 52/205 |
| 2008/0250324 A1* | 10/2008 | Ito | H04L 12/2809 715/736 |
| 2010/0058792 A1 | 3/2010 | Seo et al. | |
| 2010/0106265 A1* | 4/2010 | Ebrom | H04L 69/26 700/90 |
| 2011/0055745 A1* | 3/2011 | Penney et al. | 715/771 |
| 2011/0175742 A1* | 7/2011 | Shin | F25D 17/065 700/296 |

FOREIGN PATENT DOCUMENTS

| | | | | |
|---|---|---|---|---|
| KR | 100374558 B1 * | 3/2003 | | F25D 2700/02 |
| KR | 10-2008-0055295 A | 6/2008 | | |
| KR | 10-2010-0083686 A | 7/2010 | | |

OTHER PUBLICATIONS

Lee KR100374558 "Apparatus for Controlling Internal Temperature of a Refrigerator", English Machine Translation, Published Mar. 4, 2003 (Also published as KR 20020008945A).*

Lee, KR 100374558, "Device for Controlling Temperature of Refrigerator"; English Machine Translation, Published Feb. 1, 2002).*

* cited by examiner

| Temperature difference | Refrigerating chamber | Freezing chamber | Auxiliary door |
|---|---|---|---|
| 1 | 10 | 20 | 10 |
| 2 | 22 | 45 | 22 |
| 3 | 35 | 75 | 35 |
| ⋮ | ⋮ | ⋮ | ⋮ |

Fig. 7

| Angle | Refrigerating chamber | Freezing chamber | Auxiliary door |
|---|---|---|---|
| ~ 30 | 5 | 10 | 2 |
| ~ 45 | 6 | 11 | 2.5 |
| ~ 60 | 7 | 12 | 3 |
| ~ 90 | 8 | 13 | 3.5 |
| ⋮ | ⋮ | ⋮ | ⋮ |

Fig. 8

| Temperature difference | Refrigerating chamber | Freezing chamber | Auxiliary door |
|---|---|---|---|
| 1 | 5 | 8 | 2 |
| 2 | 8 | 13 | 3 |
| 3 | 12 | 20 | 5 |
| 4 | 17 | 29 | 8 |
| 5 | 23 | 38 | 12 |
| ⋮ | ⋮ | ⋮ | ⋮ |

Fig. 10

REFRIGERATOR AND OPERATION METHOD THEREOF

TECHNICAL FIELD

The present invention relates to a refrigerator for saving power consumption and a method of operating the same.

DISCUSSION OF THE RELATED ART

Energy savings and efficiency are currently at issue, and introduction of intelligent power networks (smart grid) are being considered to achieve efficient power usage of power consumers. Introduction of intelligent power networks may be followed by a variable power rates system in which power rates may be varied.

Accordingly, there is a need for a technology that may save an amount of power consumption consumed by home appliance.

SUMMARY

An object of the present invention is to provide a refrigerator that may save power consumption, which may be additionally caused by a door of the refrigerator.

Objects of the present invention are not limited thereto, and other objects of the present invention may be also apparently understood by those of ordinary skill from the detailed description.

To achieve the above-described objects, a refrigerator is provided to be able to save power rates according to an embodiment of the present invention. A refrigerator according to an embodiment of the present invention includes a door; a communication unit; a sensing unit; a memory unit; an output unit; and a controller configured to sense an opening state of the door through the sensing unit, obtain power consumption information consumed as the door is opened from the memory unit considering at least one of the opening state of the door and the attribute of the door and configured to output through the output unit power rates information corresponding to the power consumption information, considering power information received through the communication unit.

The opening state of the door may include at least one of a time during which the door is opened, a temperature difference between an inside and outside of the refrigerator, and an angle at which the door is opened. The attribute of the door may include at least one of a section type and a section size of the refrigerator corresponding to the door.

The power consumption information may include an amount of power consumption consumed by a refrigerating operation required as the door is opened.

The output unit may include at least one of an image displaying unit and a sound output unit. At this time, the power rates information may be selectively output through at least one of the image displaying unit and the sound output unit according to a predetermined condition.

The controller may be configured to output the power rates information such that an output attribute of the power rates information is changed depending on the size of the power rates information.

The controller may be configured to further output through the output unit a real-time power rates when the door is opened based on the power information.

The controller may be configured to output the power rates information one or more times according to a predetermined time interval. As the count of outputting the power rates information is increased, the predetermined time interval may be reduced.

According to the present invention, the following effects may be achieved.

First, an additional power rates may be calculated considering power information (power rates information) changing in real time when a user opens the refrigerator's door, so that the additional power rates may be provided to the user in real time.

Second, a user may easily realize an additional power rates incurred as the user opens the refrigerator's door, so that the user may be induced to save power consumption caused by the door's opening.

Third, as the size of the additional power rates caused by the door's opening is further increased, various methods of notifying the power rates to a user may be applied, so that the user may be induced to save power consumption in a more effective manner.

Finally, a method of outputting the additional power rates incurred as the door is opened may be applied differently based on an opening state of the door, so that a user may more easily approach information on the additional power rates, and accordingly, the user may be induced to save power consumption even further effectively.

BRIEF DESCRIPTION OF THE DRAWINGS

The embodiments of the present invention will become readily apparent by reference to the following detailed description when considered in conjunction with the accompanying drawings wherein.

DESCRIPTION OF THE EMBODIMENTS

The above objects, features, and advantages are more apparent from the detailed description taken in conjunction with the accompanying drawings. Preferred embodiments of the present invention will be described with reference to the accompanying drawings. The same reference numerals refer to the same elements throughout the specification. When determined to make the subject matter of the invention unnecessarily unclear, the detailed description of known functions or configurations associated with the present invention will be omitted.

<Overall System Configuration>

Figure 1:
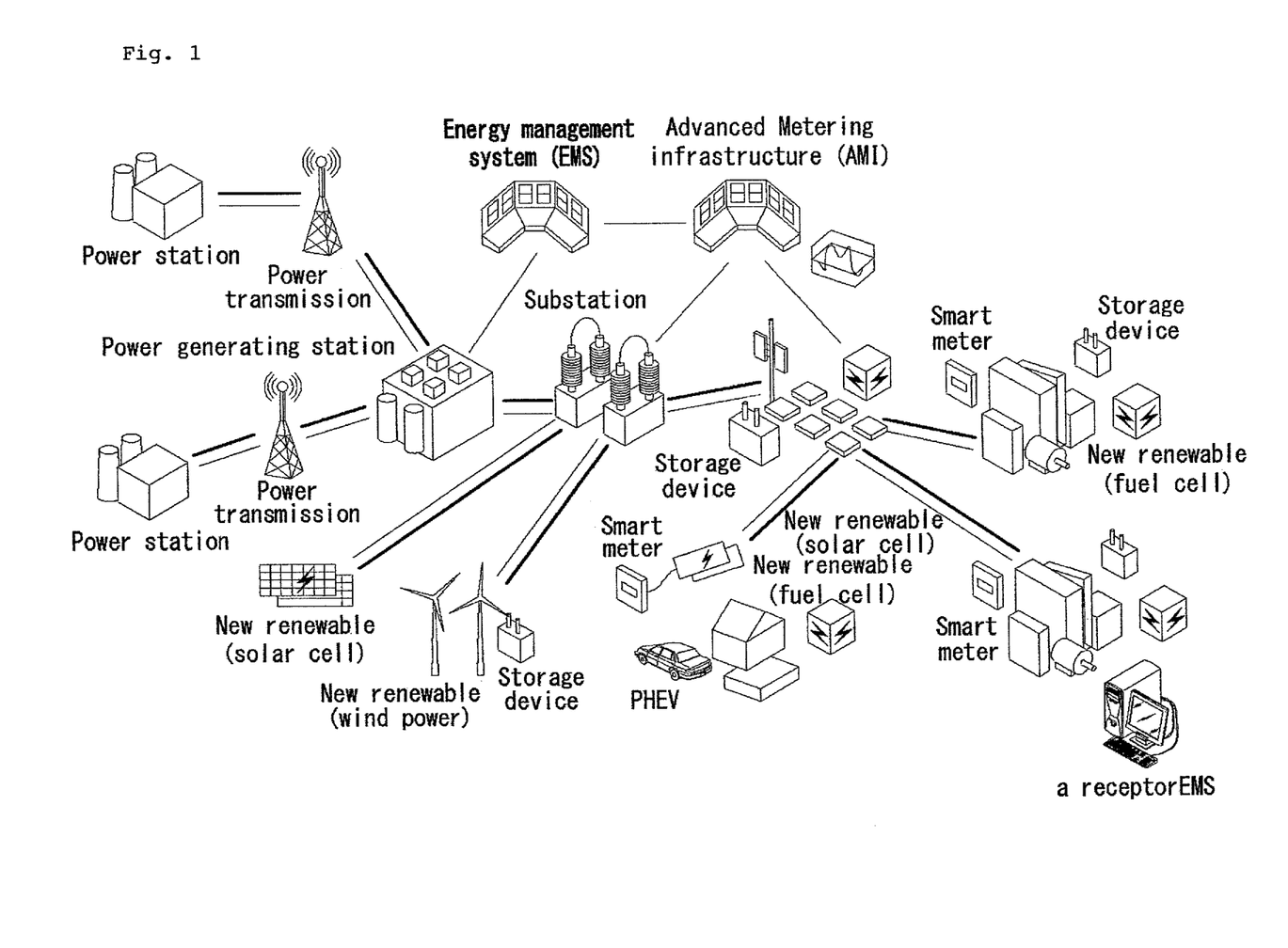
FIG. 1 is a view schematically illustrating a configuration of a smart grid.

FIG. 1 is a schematic view illustrating a smart grid. The smart grid includes power generating stations generating power through thermal power generation, nuclear power generation or water power generation, a solar cell power station using sunshine and a wind power station using wind power as new renewable energy.

The thermal power, nuclear power, or water power generating station sends electric power to a power station through a power line and the power station forwards the power to a power transforming station which may then distribute the power to consumers such as homes or offices.

The electricity generated by new renewable energy is forwarded to the power transforming station that then distributes the electricity to each consumer. The electricity sent from the power transforming station is distributed to offices or homes via a power storage device.

A home, which uses a home area network (HAN), may generate electricity on its own through solar cells or fuel cells installed in plug in hybrid electric vehicles (PHEVs) and may devote the electricity to its use while selling the remainder thereof to an external organization.

A smart meter and/or smart server is prepared in the office or home to allow power consumed by each consumer or power rates to be figured out. Accordingly a user may consider how to save power consumption or power rates according to situations by recognizing the current power consumption and power rates.

Meanwhile, the power generating stations, power station, storage device and consumers may perform bilateral communication. Accordingly, rather than the consumers being unilaterally fed with electricity, power generation and distribution may be done to fit the circumstances of the consumers by notifying the consumer's circumstances to the storage device, power station, and power generating stations.

Meanwhile, in the smart grid, an energy management system (EMS) in charge of real-time power management and real-time power consumption prediction for consumers and an advanced metering infrastructure (AMI) providing real-time metering on power consumption may play a pivotal role.

Here, the advanced metering infrastructure (AMI) in the smart grid is an infrastructure technology in which consumers may be integrated based on an open architecture. The advanced metering infrastructure (AMI) may allow consumers to efficiently use power while providing power suppliers with capability to explore system troubles and to efficiently operate the system.

Here, the "open architecture" means that in the smart grid system other than general communication networks all electric devices, whatever the manufacturer is, may be connected with one another.

Accordingly, the advanced metering infrastructure (AMI) used in the smart grid provides a consumer-friendly efficiency such as prices to devices.

In other words, a real-time price signal from a power market is relayed to each home through an energy management system (EMS) installed in the home, and the energy management system (EMS) communicates with each electric device and controls the electric device. Accordingly, a user realizes power information of each electric device by viewing the energy management system (EMS), and based on the power information, manages power information such as a setting of power consumption limit or a power rates limit, thereby saving energy or expenses.

Here, the energy management system (EMS) may consist of a local energy management system (EMS) used in an office or a home and a central energy management system (EMS) that communicates with the local energy management system (EMS) in a bilateral manner and that processes information collected by the local energy management system (EMS). Further, as used herein, the energy management system (EMS) may also be referred to by other terms, such as smart server, smart home server, power managing server, home server, or other similar names.

Since in the smart grid power information may be subjected to real-time communication between a supplier and a consumer, "real-time power network response" may be realized, and thus, high expenses required to determine peak demand may be reduced.

Figure 2:
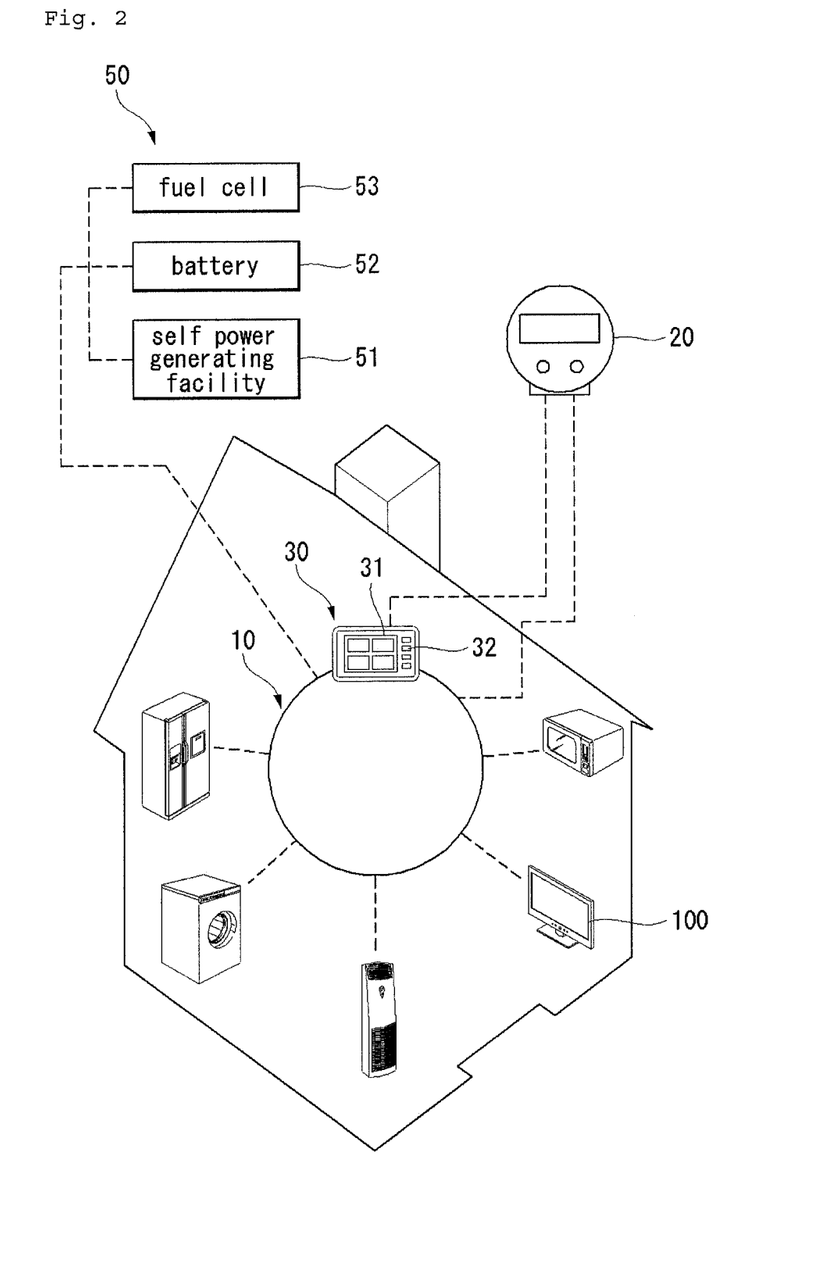
FIG. 2 is a view illustrating a power management network according to an embodiment of the present invention.

FIG. 2 shows a power management network 10 in a home that is a main consumer of the smart grid.

The power management network 10 includes a metering device (smart meter) 20 or an energy management system (EMS) 30 that may perform real-time metering on power supplied to each home and power rates.

Here, the power rates may be charged based on an hourly-basis system. In a time period during which power consumption is sharply increased, the per-hour power rates may go up while in a nighttime period during which power consumption is relatively low, the per-hour power rates may go down.

Here, the energy management system 30 may be a terminal including a screen 31 that displays a current power consumption state and external environments (temperature, moist) and input buttons 32 for a user's manipulation.

The energy management system 30 or the metering device 20 may be connected to electronic devices such as a DTV (Digital Television, 100), a refrigerator, a washing machine, a dryer, an air conditioner, an illuminating device, a light-blocking device, a dish washer, a cooker, a home server or a personal computer in the home and may perform bilateral communication with the electric devices. That is, the energy management system 30 may manage power consumed by the electronic devices included in the power management network 10 and may supply power to the electronic devices. In some cases, the energy management system 30 may control the operation of the electronic devices. For example, the energy management system 30 may control an On/Off state of the electronic devices through the power management network 10. Meanwhile, in case the electronic device is an air conditioner, the energy management system 30 may control a setting temperature, strength of wind, or operation mode of the air conditioner.

Communication in the home may be done wirelessly or wiredly. For example, the energy management system 30 may communicate with the electronic devices through a wireless technology such as Zigbee, WiFi, or Bluetoot or through a wired technology such as power line communication (PLC). The electronic devices may communicate with other electronic devices.

Meanwhile, the power management network 10 includes an auxiliary power source 50 prepared in the home, for example, a self power generating facility 51 such as a solar cell power generating device and a battery 52 that may save power generated in the self power generating facility.

Besides the battery 52, a fuel cell 53 may be connected to the power management network 10 and may function as an auxiliary power source.

Here, the auxiliary power source 50 supplies power to the home while the home is not fed power from an external power source, e.g., a power company.

The amount of power that may be supplied from the auxiliary power source or the amount of power charged in the auxiliary power source 50 may be displayed on the energy management system 30 or the metering device 20.

<Configuration of Refrigerator>

Figure 3:
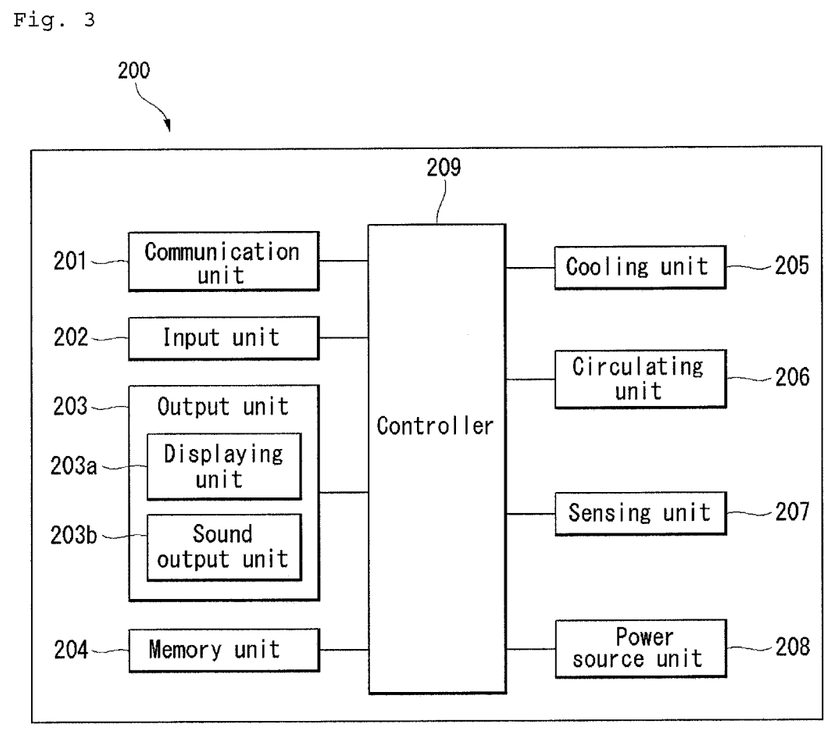
FIG. 3 is a block diagram illustrating a configuration of a refrigerator according to an embodiment of the present invention.

A configuration of a refrigerator according to an embodiment of the present invention is described in connection with FIGS. 3 and 4. FIG. 3 is a block diagram illustrating a configuration of a refrigerator according to an embodiment of the present invention, and FIG. 4 is a front view schematically illustrating an outer appearance of a refrigerator according to an embodiment of the present invention.

Referring to FIG. 3, a refrigerator 200 may include a communication unit 201, an input unit 202, an output unit 203, a memory unit 204, a cooling unit 205, a circulating unit 206, a sensing unit 207, a power source unit 208, and a controller 209. At this time, the output unit 203 may include a displaying unit 203a and a sound output unit 203b.

Figure 4:
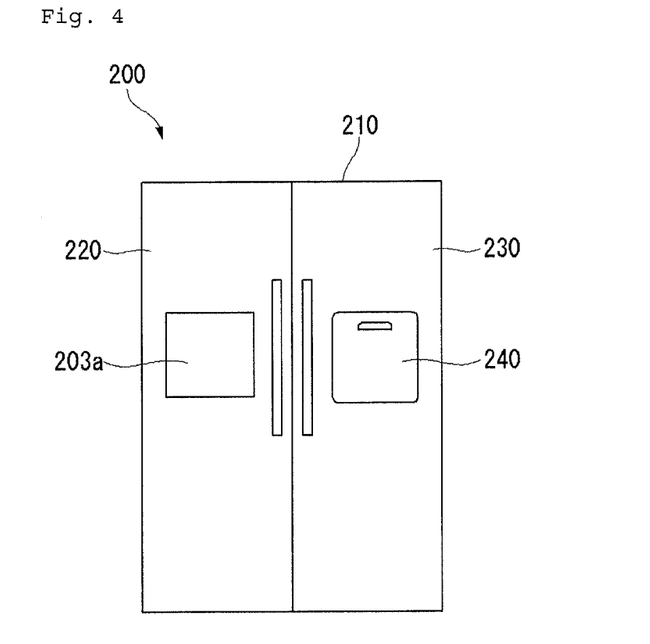
FIG. 4 is a front view schematically illustrating an outer appearance of a refrigerator according to an embodiment of the present invention.

Meanwhile, referring to FIG. 4, the main body 210 of the refrigerator 200 is shaped substantially as a rectangular parallelepiped and has a storage space for storing food.

The storage space in the main body 210 may be partitioned into two or more spaces, which may be set to different temperatures, respectively. For example, the storage space may be divided into a refrigerating chamber 211 and a freezing chamber 212. The storage spaces may have respective closable doors. For example, the main body 210 may have a freezing chamber door 220 and a refrigerating chamber door 230 provided to be rotatable to the left and right. The storage spaces may be selectively closed from the outside of the refrigerator 200 by the doors 220 and 230. Further, the refrigerator 200 may have an auxiliary door 240 prepared in the refrigerating chamber door 230.

The communication unit 201 may transmit/receive data to/from other electronic devices included in the power management network 10 and/or the energy management system 30 through the power management network 10. Further, the communication unit 201 may communicate with an external electronic device through a separate network different from the power management network 10.

For example, the communication unit 201 may receive smart grid information from the energy management system 30 or an external electronic device in a wired manner (e.g., through Ethernet or PLC) or in a wireless manner (e.g., through Zigbee). In other words, the communication unit 201 may receive smart grid information through various communication protocols such as wired Internet, wireless Internet, portable Internet, or mobile communication networks. The smart grid information includes power rates information and/or power demand information. The power rates information and/or power demand information may be varied in real time or periodically. Further, the smart grid information may be provided from a power supplier.

The input unit 202 generates input data for entering data or for controlling the operation of the refrigerator 200. The input unit 202 is not limited to a specific implementation. In general, a keypad, a wheel, a touch pad, a touch screen, or a combination of two or more thereof may be used. Recently, according to use of broader space, demand for expanded display screen, and considerations in design, touch screen is employed a lot, and in such case, the input unit 202 may be integrated with a displaying unit 203a to be described later.

The output unit 203 outputs various necessary data. The output unit 203 generates visual or audible outputs and may include a displaying unit 203a and a sound output unit 203b.

The memory unit 204 stores data necessary for operating the refrigerator 200. For example, the memory unit 204 may store data received through the communication unit 201 and/or data entered through the input unit 202.

The cooling unit 205 lowers the temperature of a coolant to leave the inside of the refrigerating chamber and/or freezing chamber at a low temperature.

The circulating unit 206 allows a coolant cooled by the cooling unit 205 to circulate in the inside of the refrigerator 200 so that the temperature of the inside of the refrigerator may be kept at a proper level.

The cooling unit 205 and the circulating unit 206 may be intermittently operated depending on the temperature for refrigerating or freezing as set in the refrigerator 200. For example, assuming the setting temperature of the refrigerating chamber of the refrigerator 200 is 3° C., when the actual temperature of the refrigerating chamber is currently 4° C., the cooling unit 205 and the circulating unit 206 may be operated to reduce the temperature of the refrigerating chamber to the setting temperature. However, in case the actual temperature of the refrigerating chamber is currently 2° C., the cooling unit 205 and the circulating unit 206 may stay unoperated.

The sensing unit 207 obtains information on the current state of the refrigerator 200. For example, the sensing unit 207 may measure the state of opening of the freezing chamber door 220, the refrigerating chamber door 230 and the auxiliary door 240. That is, the sensing unit 207 may sense whether the doors 220, 230, and 240 are opened or closed and may also sense an angle of opening of the doors 220, 230, and 240. Further, the sensing unit 207 may sense the temperature of the inside of the storage space in the refrigerator 200 and may sense the temperature of the outside of the refrigerator 200. Or, the sensing unit 207, in case a door of the refrigerator 200 is opened, may sense the attribute of the opened door. For example, the sensing unit 207 may obtain information on whether the opened door is the freezing chamber door 220, the refrigerating chamber door 230, or the auxiliary door 240.

The power source unit 208 is fed power from the external power source and/or auxiliary power source and supplies power necessary for operation to each component in the refrigerator 200. The power source unit 208 may include a battery included in the refrigerator 200, other than the external power source and/or the auxiliary power source.

The controller 209 generally manages the overall operation of the refrigerator 200. Further, the controller 209 controls the operation of the communication unit 201, the input unit 202, the output unit 203, the memory unit 204, the cooling unit 205, the circulating unit 206, the sensing unit 207, and the power source unit 208.

<Operating Method>

Hereinafter, a method of operating a refrigerator according to an embodiment of the present invention is described.

As used herein, the "amount of power consumption" means an amount of the power consumed for a predetermined time by an electronic device or by one or more modules included in the electronic device. Further, the power information included in the smart grid information intends to include information on a power fee (i.e., power rates) charged for the power consumption information per unit time. Accordingly, a power rates charged by an electric power company may be determined based on the amount of power consumption amount and the power rates.

Figure 5:
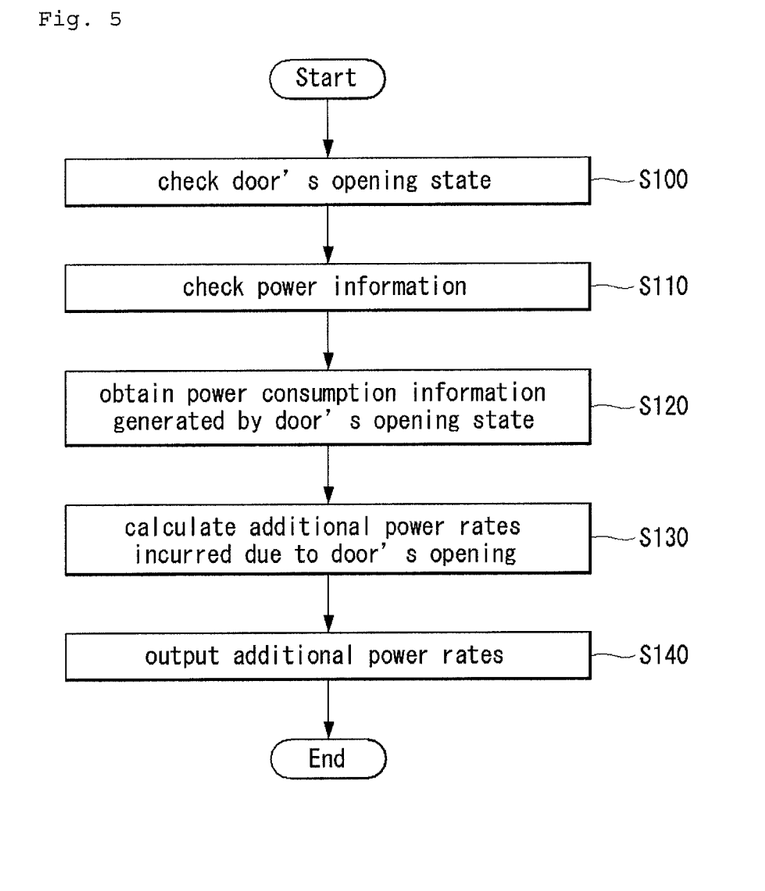
FIG. 5 is a flowchart illustrating a method of operating a refrigerator according to an embodiment of the present invention.

FIG. 5 is a flowchart illustrating a method of operating a refrigerator according to an embodiment of the present invention.

Referring to FIG. 5, the refrigerator 200 identifies an opening state of a door and/or an attribute of the door (S100).

As used herein, the "opening state" of a door includes a specific state of the door's opening as well as whether the door is opened. In particular, the door's opening state may include all kinds of information that may become variables of a function for predicting the amount of power additionally consumed due to the door's opening as is described later.

Specific examples of the refrigerator 200 identifying a door's opening state are now described.

As described above, the freezing chamber door 220 and the refrigerating chamber door 230 are provided to the main body 210 to be rotatable to the left or right. The refrigerator 200 may identify an angle at which the door is opened.

Further, the refrigerator 200, while a door is left opened, may identify the temperature of the inside of the storage chamber of the refrigerator 200 corresponding to the opened door and the temperature of the outside of the refrigerator 200. For example, in case the refrigerating chamber door 230 is opened, the temperature of the inside of the refrigerating chamber corresponding to the refrigerating chamber door 230 and the temperature of the outside of the refrigerator 200 may be identified.

Subsequently, the refrigerator 200 identifies smart grid information received through the communication unit 201 (S110). That is, power information such as current power rates and/or power demand information is identified.

As used herein, the "attribute" of a door may include the type of a storage chamber of the refrigerator 200 corresponding to the door or the size of the door.

That is, the refrigerator 200 may identify which door is currently left opened. For example, the refrigerator 200 may identify whether the opened door is the freezing chamber door 220, the refrigerating chamber door 230, or the auxiliary door 240. Meanwhile, the refrigerator 200 may identify the size of the door that is currently left opened. The size of each door 220, 230, and 240 may be left stored in the memory unit 204.

The refrigerator 200 obtains the power consumption information caused by the door's opening based on the obtained door's opening state and power information (S120).

<Concept of an Amount of Power Consumption and Method of Obtaining the Same>

The amount of power consumption may be the overall amount of power consumption consumed by the refrigerator 200 while a door is kept open, or preferably, may be the amount of additional power consumption consumed by the refrigerator 200 due to the door's opening.

Typically, the refrigerator 200 operates to maintain a preset temperature, and such preset temperature should be preferably maintained at all times. Accordingly, the refrigerator 200 continues to consume power. That is, a general amount of power is being always consumed. At this time, if a door of the refrigerator 200 is opened, the additional power consumption is predicted as follows:

(1) First additional power consumption: power consumed by operating an internal illumination device (not shown in the drawings) that allows the inside of the refrigerator 200 to be viewed even better (2) Second additional power consumption: power consumed by operation to minimize leakage of cooled air that may be caused when a door of the refrigerator 200 is opened (3) Third additional power consumption: power consumed by a cooling operation for reducing the temperature of the inside of the refrigerator 200 as the temperature of the inside of the storage chamber in the refrigerator 200 is elaborated to more than a preset temperature while a door of the refrigerator 200 stays opened.

Further, as used herein, the power consumption information caused by a door's opening means preferably at least one of the first additional power consumption to the third additional power consumption or a sum thereof. Of course, besides what is described above, more power may be consumed as the door is opened, but the detailed description thereof may make the subject matter of the invention unclear.

Further, the amount of power consumption may be the amount of additional power actually consumed as the door of the refrigerator 200 is opened, preferably the amount of power consumption predicted to be additionally generated due to the door's opening.

The refrigerator 200 may obtain an actual amount of power consumption from an internal/external power meter while the door of the refrigerator 200 is left open. At this time, the additional power consumption caused by the opening of the door of the refrigerator 200 may be obtained by deducting the average power consumption information consumed by the refrigerator 200 while the door stays closed, from the obtained actual amount of power consumption. The external power meter of the refrigerator 200 may be a smart meter described above. Further, the power consumption information consumed by the refrigerator 200 with the door left closed may be a value that has been calculated in advance. The value may be stored in the memory unit 204.

For example, in case the overall amount of power consumption obtained from the power meter while the door is opened is 20 and the average amount of power consumption consumed by the refrigerator 200 while the door is left closed is 14, the amount of additional power consumption caused by the door's opening may be 6.

Meanwhile, as a method of predicting the amount of additional power consumption caused by the door's opening, the power consumption information due to the door's opening may be calculated based on functions, which are obtained by properly modeling. That is, there may be various algorithms for calculating the power consumption information due to the door's opening. Various variables may be used in the functions. Further, the various functions, i.e., various algorithms may be stored in the memory unit 204.

A value to which the temperature of the inside of the refrigerator 200 goes up as the door is opened may be a variable of the function. This is why the refrigerator 200 needs to always maintain a constant temperature by its essential operation, but if the door is opened and thus the inside of the refrigerator 200 rises up, the temperature of the inside of the refrigerator 200 should be adjusted to a reset temperature, which causes additional power consumption.

An angle at which the door is opened may be a variable of the function. Because as the door of the refrigerator 200 is opened thermal energy from the outside of the refrigerator 200 flows into the inside of the refrigerator 200 due to a temperature difference between the inside and outside of the refrigerator 200, thereby causing a rise in the temperature of the inside of the refrigerator 200, and the amount of thermal energy flowing into the inside of the refrigerator 200 is in proportion to the sectional area (i.e., area exposed to the outside as the door is opened) where the inside and outside of the refrigerator 200 contact each other.

A temperature difference between the inside of the refrigerator 200 and the outside of the refrigerator 200 while the door is left opened may be a variable of the function. This is because the amount of thermal energy to flow in the inside of the refrigerator 200 as the door is opened is a function for a temperature difference between the inside and outside of the refrigerator 200.

Whether the door is the freezing chamber door 220, the refrigerating chamber door 230, or the auxiliary door 240 may be a variable of the function. It is because the refrigerating chamber and the freezing chamber respectively have different setting temperatures, which should be maintained in general. That is, the setting temperature of the refrigerating chamber is typically about −20° C., and the setting temperature of the freezing chamber is typically about +4° C. As the setting temperature is decreased, more power is consumed to lower the temperature to the setting temperature. For example, assume that when the freezing chamber door 220 is opened and thus the temperature of the freezing chamber is increased to −17° C. which is about 3° C. higher than the setting temperature (e.g., −20° C.), the power consumption information to lower the temperature of the freezing chamber back to the setting temperature is A. At this time, assuming that when in the same situation the refrigerating chamber door 230 is opened and thus the temperature of the refrigerating chamber is increased to +7° C. which is about 3° C. (which is the same increment as the freezing chamber temperature) higher than the setting temperature (e.g., +4° C.), the power consumption information to decrease the temperature of the freezing chamber back to the setting temperature is B, A is larger than B. Accordingly, the type of the opened door may be a variable of the function.

Meanwhile, as another method of predicting the amount of additional power consumption caused by the door's opening, a predicted amount of the additional power consumption corresponding to the door's current opening state may be obtained by referring to a prepared matching table. The prepared matching table may be stored in the memory unit 204.

Figure 6:
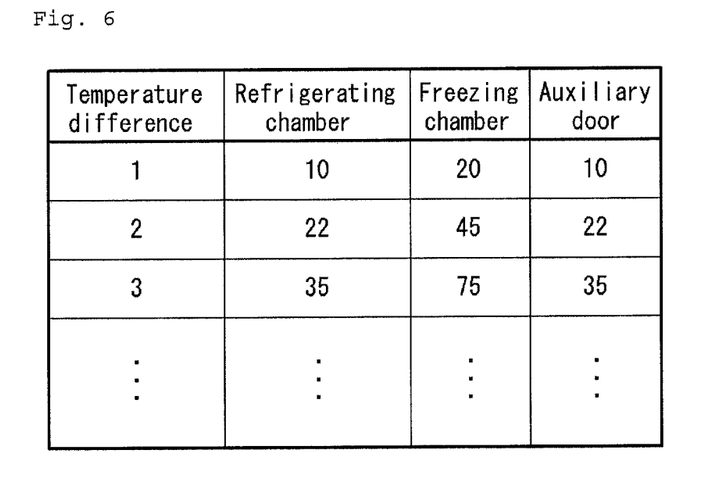
FIGS. 6 to 8 are views illustrating power consumption matching tables according to embodiments of the present invention.
Figure 7:
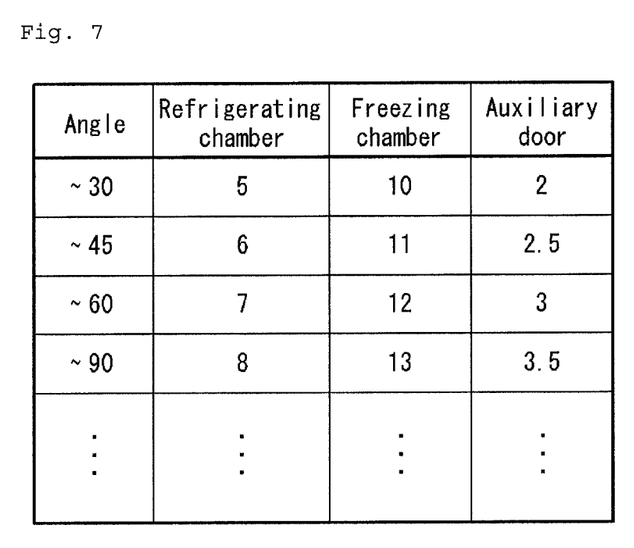
Figure 8:
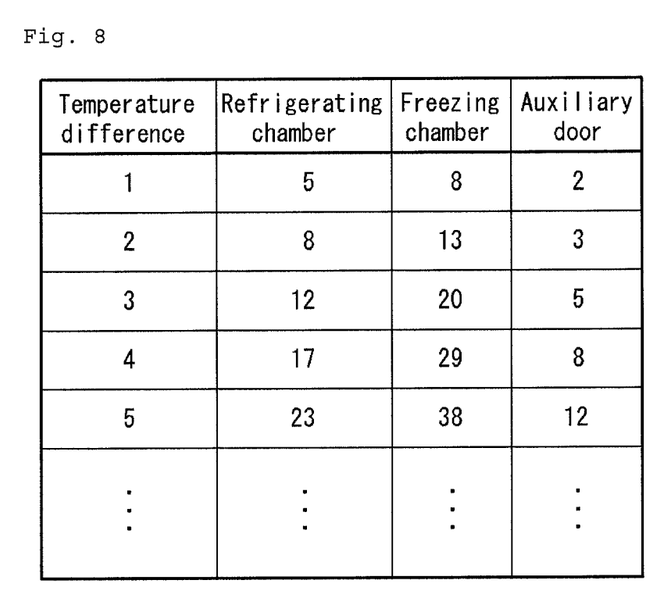

FIGS. 6 to 8 are views illustrating power consumption matching tables according to embodiments of the present invention. The amount of additional power consumption and/or the amount of additional power consumption per unit time shown in FIGS. 6 to 8 have been assumed for ease of description and accordingly may be different from the amount of additional power consumption actually consumed as the door is opened.

FIG. 6 is a view illustrating the amount of power consumption according to a temperature difference of the inside of a refrigerator between before a door of the refrigerator is opened and after the door is opened and then closed.

As shown in FIG. 6, as the temperature difference is increased, the amount of additional power consumption consumed due to the door's opening may be seen to be increased as well. Further, although the temperature difference is constant, the amount of the additional power consumption is larger when the freezing chamber door 220 is opened and then closed than when the refrigerating chamber door 230 is opened and then closed. However, since the auxiliary door 240 is connected to the refrigerating chamber, in case the temperature difference caused by opening the auxiliary door 240 is the same as the temperature difference caused by opening the refrigerating chamber door 230, the amount of power additionally consumed may be seen to be the same.

The refrigerator 200 may yield the amount of power additionally consumed due to the door's opening by sensing a temperature difference between the time the door is opened and the time the door is closed and obtaining the amount of additional power consumption corresponding to the temperature difference by using the table shown in FIG. 6.

FIG. 7 is a view illustrating an amount of power consumption according to angles at which a door is opened.

As shown in FIG. 7, as the angle in which the door is opened is increased, the amount of additional power consumption per unit time may be seen to be increased. Further, although the angle at which the door is opened remains the same, it may be seen that the amount of additional power consumption per unit time when the refrigerating chamber door 230 is opened may be smaller than that when the freezing chamber door 220 is opened. Since the auxiliary door 240 has an even more smaller cross sectional area for shielding as compared with the refrigerating chamber door 230, it may be seen that the amount of additional power consumption per unit time as the auxiliary door 240 is opened may be smaller than the amount of additional power consumption as the refrigerating chamber door 230 is opened.

By using the table shown in FIG. 7, the refrigerator 200 may yield the amount of total additional power consumption caused by the door's opening by calculating an angle at which the door 220, 230, and 240 is opened and a time from the door 220, 230, and 240 is opened until the door is closed and by multiplying the calculated time by an amount of additional power consumption per unit time corresponding to the calculated angle as shown in the table.

FIG. 8 is a view illustrating an amount of additional power consumption according to a temperature difference between the inside and outside of a refrigerator when a door is opened.

As shown in FIG. 8, it may be seen that when the door is opened, as the temperature difference between the inside and the outside of the refrigerator is increased, the amount of additional power consumption per unit time may be further increased. Further, although the temperature difference between the inside and outside of the refrigerator remains the same, the amount of additional power consumption per unit time when the refrigerating chamber door 230 is opened may be smaller than the amount of additional power consumption per unit time when the freezing chamber door 220 is opened. Since the auxiliary door 240 has an even smaller cross sectional area for shielding as compared with the refrigerating chamber door 230, it may be seen that the amount of additional power consumption per unit time as the auxiliary door 240 is opened may be smaller than the amount of additional power consumption as the refrigerating chamber door 230 is opened.

By using the table shown in FIG. 8, the refrigerator 200 may yield the amount of total additional power consumption due to the door's opening, by calculating a temperature difference between the inside and outside of the refrigerator 200 when the door 220, 230, and 240 is opened and a time from the door 220, 230, and 240 is opened until the door is closed and by multiplying the calculated time by an amount of additional power consumption per unit time corresponding to the calculated temperature difference between the inside and outside of the refrigerator as shown in the table.

The refrigerator 200 may yield an amount of the additional power consumption by using only one of the tables shown in FIGS. 6 to 8 or by referring to a combination of one or more of the tables.

Referring back to FIG. 5, description of a method of operating a refrigerator according to an embodiment of the present invention is continued.

The refrigerator 200 calculates a power rates to be additionally incurred due to the door's opening based on the power information and the power consumption information obtained in step S120 (S130).

Subsequently, the refrigerator 200 outputs the calculated power rates (S140).

Various methods may be used to output the calculated power rates.

According to an embodiment of the present invention, the refrigerator 200 may output the calculated power rates in voice through the sound output unit 203b. Or, the refrigerator 200 may output the calculated power rates in text through the displaying unit 203a. Or, the calculated power rates may be output through both the displaying unit 203a and the sound output unit 203b.

According to an embodiment of the present invention, the calculated power rates may be selectively output through the sound output unit 203b or the displaying unit 203a in accordance with a predetermined condition. For example, when the power rates is output while the door remains opened, the power rates may be output through the sound output unit 203b and after the door is closed the power rates may be output through the displaying unit 203a. It is because as shown in FIG. 4 the displaying unit 203a is typically installed on an outer wall of the refrigerator's door and the refrigerator's door is opened in most cases when a user tries to pull food out of the refrigerator, and thus if information is output through the displaying unit 203a while the door is left opened, the user cannot easily recognize the output information.

According to an embodiment of the present invention, the refrigerator 200 may output the calculated power rates, with different output attributes for the power rates, in consideration of the size of the calculated power rates in outputting the calculated power rates. For example, assuming that the power rates is output in voice, when a power rates to be additionally incurred is smaller than a predetermined reference, the voice is output relatively slow or in a relatively low voice range, and when the calculated power rates is larger than the predetermined reference, the voice may be out relatively fast or in a relatively high voice range. Meanwhile, the predetermined reference may be defined for each section and accordingly there may be a plurality of output attributes corresponding to the power rates sections. In other words, in case the power rates is separated into three sections, there may be three voice output speeds such as 'slow', 'middle', and 'fast.' The number of sections may be four or more and this is apparent to those of ordinary skill.

Meanwhile, in case the power rates is output through the displaying unit 203a, when the power rates to be additionally incurred is larger and smaller than a predetermined reference, the color and/or brightness of the power rates displayed may be changed. Or, in case the power rates is displayed to flicker, if the power rates is smaller than the predetermined reference, the period of flickering may be set to be relatively longer when displaying the power rates, and if the power rates is larger than the predetermined reference, the period of flickering may be set to be relatively shorter when displaying the power rates.

As such, by displaying the power rates such that the attribute of the power rates is changed depending on the size of the power rates, a user may be rendered further alerted for an additional power rates, and accordingly, the user may be induced to further save the power rates.

Meanwhile, according to an embodiment of the present invention, the refrigerator 200 may output the power rates multiple times according to a predetermined time interval. For example, in case a door is left opened for 45 seconds, 20 seconds after the door has been opened, a power rates additionally incurred for 20 seconds after the door has been opened is output, 35 seconds after the door has been opened, a power rates additionally incurred for 35 seconds after the door has been opened is output, 40 seconds after the door has been opened, a power rates additionally incurred for 45 seconds after the door has been opened is output, and after the door is closed, a power rates additionally incurred while the door is left opened may be output.

At this time, the refrigerator 200 may output the additional power rates such that the interval of outputting the power rates is decreased as time elapses. In the foregoing example, it can be seen that although a time interval after the door has been opened until the first additional power rates is 20 seconds, the second output is done 15 seconds after the first output, and the third output is done 10 seconds after the second output. Generally, as the time during which the door of the refrigerator is left opened increases, the power rates to be additionally incurred may be increased in a non-linear manner. Accordingly, for a user to be further alerted of incurrence of an additional power rates, the time interval at which the power rates is output as time passes by may be rendered further small when the power rates is output.

As described above, a user may be further warned of incurrence of an additional power rates caused by a door's opening by outputting the power rates plural times, so that the user is induced to further save the power rates.

Figure 9:
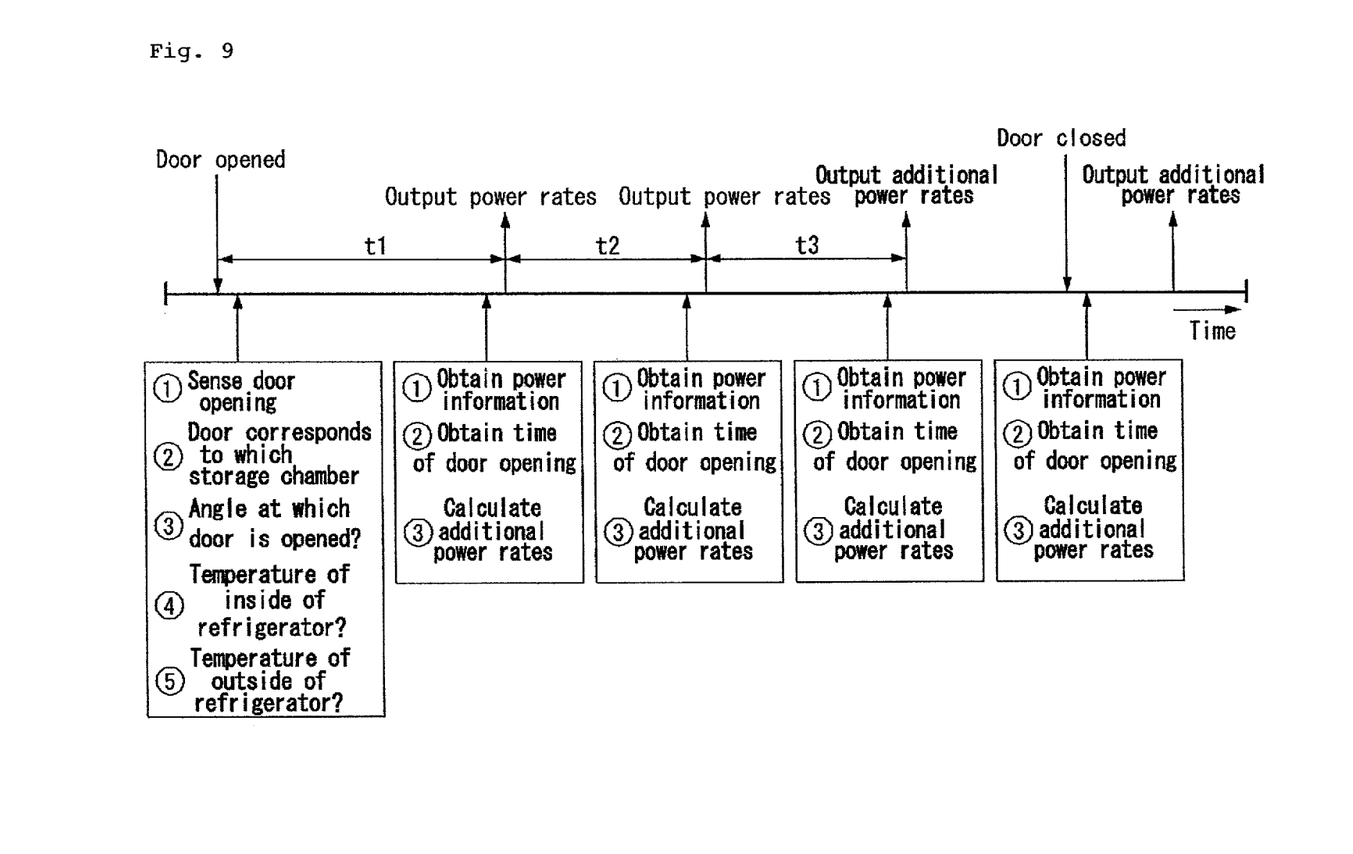
FIG. 9 is a view illustrating a method of operating a refrigerator over time in case a door of the refrigerator is opened according to an embodiment of the present invention.

FIG. 9 is a view illustrating a method of operating a refrigerator over time in case a door of the refrigerator is opened according to an embodiment of the present invention.

Referring to FIG. 9, if the door is opened, the refrigerator 200 performs step S100. In other words, the refrigerator 200 senses the door's opening through the sensing unit 207 and may sense which one of the plurality of doors 220, 230, and 240 in the refrigerator is opened, and may obtain information on an angle at which the door is opened, a temperature of the inside of the refrigerator 200 when the door is opened, and a temperature of the outside of the refrigerator 200 when the door is opened.

Subsequently, a predetermined time t1 after the door has been opened, the refrigerator 200 may perform steps S110 to S130. That is, the refrigerator 200 may calculate a time during which the door has been opened, may obtain the amount of additional power consumption for time t1 based on information obtained by performing step S100 and the calculated time, may obtain a current power rates per unit time by identifying the power information, and may calculate an additional power rates based on the power rates per unit time and the amount of additional power consumption. At this time, step S110 need not be performed after time t1 has elapsed, may be performed at the time that the door is opened or before the door is opened.

Subsequently, the refrigerator may output the calculated power rates information (S140).

A predetermined time t1 after the power rates information has been output, the refrigerator 200 may perform steps S110 to S130 again. Step S110 need not be performed again after time t2 has elapsed, and the previously obtained predetermined information may be reused. Meanwhile, in case the door's opening state is changed while time t2 passes by, for example in case the door's angle of opening is varied or in case the temperature of the inside/outside of the refrigerator 200 is changed, step S100 may be carried out again. Accordingly, a power rates for the amount of additional power consumption for time t1+t2 may be calculated. The calculated power rates may be output again (S140).

As shown, time t3 after this, an additional power rates may be calculated/output once more. At this time, as described above, t1 may be smaller than t2, and t3 may be smaller than t2.

Further, while the door is left opened, the additional power rates may be output in voice through the sound output unit 203b and the attribute of the output voice may be changed.

Thereafter, when the door of the refrigerator is closed, a power rates additionally incurred due to the door's opening may be calculated once more and may be output again (S140).

At this time, the power rates may be output through the sound output unit 203b or may be output through the displaying unit 203a.

Figure 10:
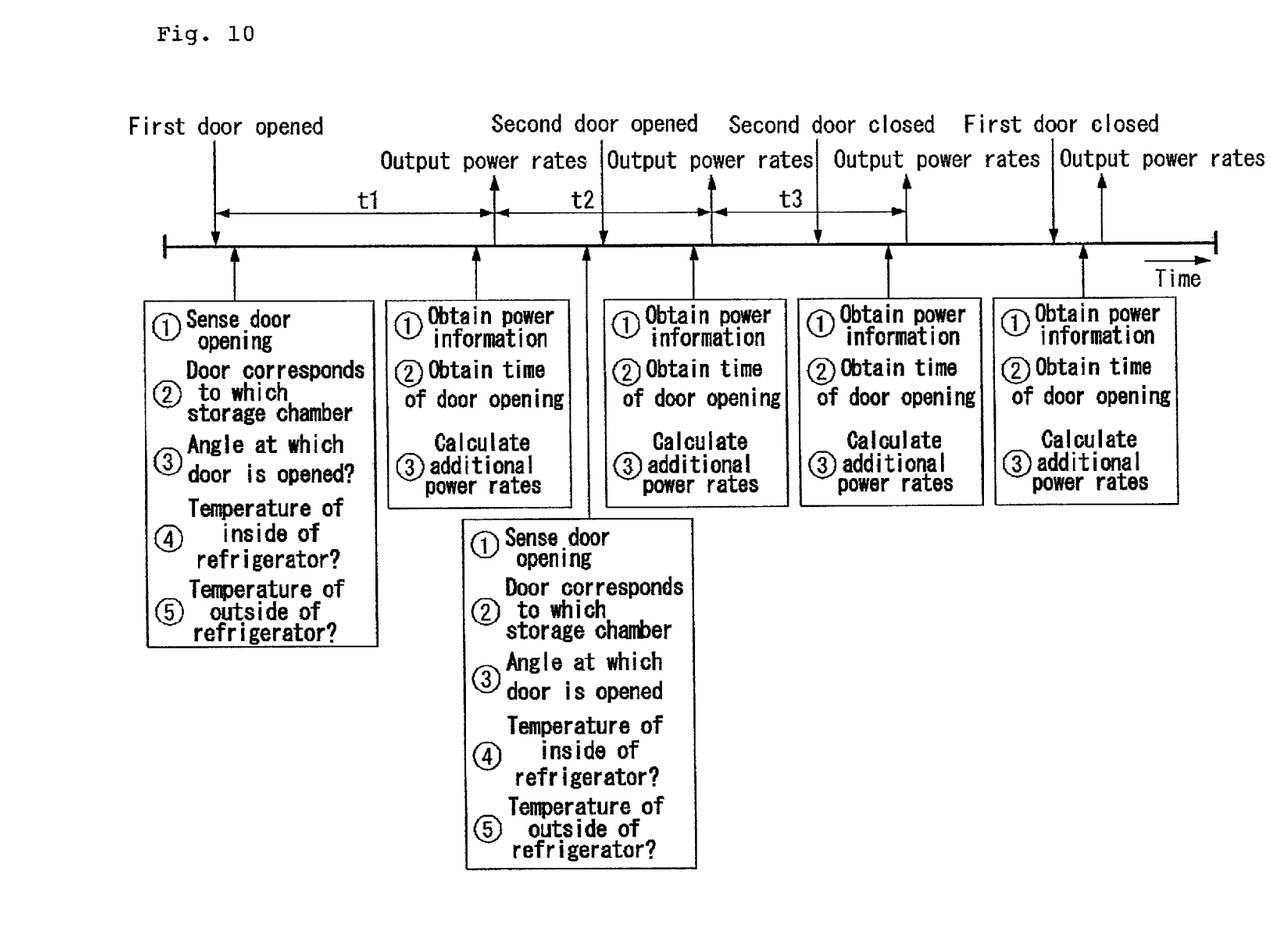
FIG. 10 is a view illustrating a method of operating a refrigerator over time in case one or more doors of the refrigerator are opened according to an embodiment of the present invention.

FIG. 10 is a view illustrating a method of operating a refrigerator over time in case one or more doors of the refrigerator are opened according to an embodiment of the present invention.

In case a first door is opened, the refrigerator 200 may sequentially perform steps S100 to S140 as described above in connection with FIG. 9. At this time, in case a second door is opened with the first door opened, the refrigerator 200 performs step s100 on the second door so that when a power rates is calculated/output, an additional power rates incurred by the first door may be added to an additional power rates incurred by the second door, and the added power rates may be output. Meanwhile, in case the second door is closed with the first door opened, rather than the power rates being immediately calculated and output, the power rates may be calculated and output at a time (t1+t2+t3) determined by the time that the first door is opened. Meanwhile, although not shown in the drawings, in case the second door is closed, power rates information for the amount of additional power consumption as the second door is opened may be separately output.

Subsequently, in case the first door is closed, a power rates additionally incurred due to the opening of the first and second doors may be output. At this time, the power rates additionally incurred by the first door and the power rates additionally incurred by the second door may be separately output.

The various embodiments described herein may be implemented in a medium that is readable by a computer or its similar device using software, hardware, or a combination thereof.

When implemented in hardware, the embodiments described herein may be embodied using at least one of ASICs (application specific integrated circuits), DSPs (digital signal processors), DSPDs (digital signal processing devices), PLDs (programmable logic devices), FPGAs (field programmable gate arrays, processors, controllers, microcontrollers, microprocessors, and electrical units for performing functions.

When implemented in software, the embodiments such as procedures or functions may be realized together with a separate software module that enables at least one function or operation to be conducted. Software codes may be implemented in a software application written in a proper programming language. Further, the software codes may be stored in a memory and may be executed by a controller.

What is claimed is:

1. A refrigerator comprising:
    a freezing chamber door, a refrigerating chamber door and an auxiliary door in the refrigerating chamber door;
    a communication unit configured to receive smart grid information including power rate information and power demand information from a power managing server of a power management network, the smart grid information being varied in real time or periodically, the smart grid information provided from a power supplier;
    a sensing unit configured to sense an attribute of an opened door and an opening state of the door;
    a memory configured to pre-store a power consumption matching table corresponding to at least one of the opening state of the at least one opened door and the attribute of the at least one opened door;
    an output unit; and
    a controller configured to:
        determine that at least one of the doors is opened;
        obtain power consumption information consumed by the at least one opened door considering the opening state of the at least one opened door and the attribute of the at least one opened door based on the pre-stored power consumption matching table;
        calculate an additional power rate incurred due to the at least one opened door based on the obtained power consumption information and the smart grid information; and
        output, through the output unit, power rate information corresponding to the additional power rate,
    wherein the attribute of the at least one opened door comprises information about which of the freezing chamber door, the refrigerating chamber door and the auxiliary door is the at least one opened door,
    wherein power consumption varies according which of the freezing chamber door, the refrigerating chamber door and the auxiliary door is the at least one opened door, and
    wherein an opening state of the at least one opened door includes a time during which the at least one opened door is opened, a temperature difference between an inside and an outside of the refrigerator, and an angle at which the at least one opened door is opened.

2. The refrigerator of claim 1, wherein the attribute of the at least one opened door further comprises at least one of a section type and a section size of the refrigerator corresponding to the at least one opened door.

3. The refrigerator of claim 1, wherein the power consumption information includes a power consumed for a refrigerating operation required as the at least one opened door is opened.

4. The refrigerator of claim 1, wherein the output unit includes at least one of an image displaying unit and a sound output unit.

5. The refrigerator of claim 4, wherein the power rate information is selectively output through at least one of the image displaying unit and the sound output unit according to a predetermined condition.

6. The refrigerator of claim 1, wherein the controller is configured to output the power rate information such that an output attribute of the power rate information is changed depending on a size of the power rate information.

7. The refrigerator of claim 1, wherein the controller is configured to further output through the output unit a real-time power rates when the at least one opened door is opened, based on the smart grid information.

8. The refrigerator of claim 1, wherein the controller is configured to output the power rate information one or more times according to a predetermined time interval.

9. The refrigerator of claim 8, wherein as a count of outputting the power rate information is increased, the predetermined time interval is reduced.

10. The refrigerator of claim 1, further comprising a memory configured to store an algorithm to obtain the power consumption information consumed as the at least one opened door is opened, considering at least one of the opening state of the at least one opened door and the attribute of the at least one opened door.

* * * * *